United States Patent
Ko et al.

(10) Patent No.: US 6,472,327 B2
(45) Date of Patent: Oct. 29, 2002

(54) METHOD AND SYSTEM FOR ETCHING TUNNEL OXIDE TO REDUCE UNDERCUTTING DURING MEMORY ARRAY FABRICATION

(75) Inventors: King Wai Kelwin Ko, San Jose; Mark S. Chang, Los Altos; Hao Fang, Cupertino, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/925,205

(22) Filed: Aug. 8, 2001

(65) Prior Publication Data

US 2002/0028583 A1 Mar. 7, 2002

Related U.S. Application Data

(62) Division of application No. 09/368,323, filed on Aug. 3, 1999.

(51) Int. Cl.[7] .............................................. H01L 21/304
(52) U.S. Cl. .................... 438/704; 438/195; 438/264
(58) Field of Search ................................. 438/195, 257, 438/264, 594, 704, FOR 123, FOR 203

(56) References Cited

U.S. PATENT DOCUMENTS

| | | | | |
|---|---|---|---|---|
| 5,057,186 A | * | 10/1991 | Chew et al. |
| 5,089,434 A | * | 2/1992 | Hollinger |
| 5,266,530 A | * | 11/1993 | Bagley et al. |
| 5,567,982 A | * | 10/1996 | Bartelink |
| 5,619,097 A | * | 4/1997 | Jones |
| 5,663,584 A | * | 9/1997 | Welch |
| 5,731,604 A | * | 3/1998 | Kinzer |
| 5,830,774 A | * | 11/1998 | Klingbeil, Jr. et al. |
| 5,953,614 A | * | 9/1999 | Liu et al. |
| 6,190,424 B1 | * | 2/2001 | Koike |
| 6,207,974 B1 | * | 3/2001 | Kinzer |
| 6,212,319 B1 | * | 4/2001 | Cayrefourcq |
| 6,300,251 B1 | * | 10/2001 | Pradeep et al. |

* cited by examiner

*Primary Examiner*—Wael Fahmy
*Assistant Examiner*—Joannie Adelle Garcia
(74) *Attorney, Agent, or Firm*—Sawyer Law Group LLP

(57) ABSTRACT

A method and system for etching gate oxide during transistor fabrication is disclosed. The method and system begin by depositing a gate oxide on a substrate, followed by a deposition of a tunnel oxide mask over a portion of the gate oxide. The method and system further include performing a combination dry/wet-etch to remove the gate oxide uncovered by the tunnel oxide mask, which minimizes tunnel oxide undercut.

1 Claim, 4 Drawing Sheets

METHOD AND SYSTEM FOR ETCHING TUNNEL OXIDE TO REDUCE UNDERCUTTING DURING MEMORY ARRAY FABRICATION

CROSS-REFERENCE TO RELATED APPLICATIONS

The present application is a divisional of U.S. Ser. No. 09/368,323, filed Aug. 3, 1999, and assigned of record to Advanced Micro Devices, Inc., of Sunnyvale, Calif.

FIELD OF THE INVENTION

The present invention relates to memory arrays, and more particularly to a method and system for etching tunnel oxide to reduce undercutting during memory array fabrication.

BACKGROUND OF THE INVENTION

Achieving higher densities on a memory chip is a common goal during chip fabrication. The various processes and techniques used to manufacture chips have therefore become increasingly important. Part of the process involved in manufacturing a flash memory array, for example, requires generating select gate transistors and word-line transistors on a silicon substrate with different gate oxide thickness, as shown in FIGS. 1 and 2.

FIG. 1A is a top view of a portion of a flash memory array 10 showing a select gate region 12 of the chip where select gates 14 are located and a word-line region 16 where word-line gates 18 are located. FIG. 1B is a cross-sectional view of the memory array 10. Both the select gate 14 and word-line gate 18 are grown over a gate oxide layer, but the select gate 14 requires a thicker layer of gate oxide than does the word-line gate 18. The process used to build this array structure 10 determines how close the gates 14 and 18 can be located on the substrate 22.

FIGS. 2A–2B are cross-sectional views of the substrate showing a conventional process for forming the select gate region 12 and the word-line region 16. First, a layer of gate oxide is applied to both regions of the substrate to a depth of approximately 150 angstroms, followed by a deposition of a tunnel oxide mask 24, as shown in FIG. 2A.

Thereafter, a wet-etch process is performed to remove the gate oxide 20 in the word-line region 16 that is not covered by the tunnel oxide mask 24, as shown in FIG. 2B. A conventional wet-etch process is isotropic or unidirectional meaning that the material being etched is etched in all directions at the same rate. After the gate oxide 20 is removed from the word-line region 16, the tunnel oxide mask 24 is removed. This is followed by tunnel oxidation where a layer of gate oxide is grown over both regions.

Referring again to FIG. 1B, due to the growth rate difference of the gate oxide 20 and the substrate 22, the process will result in a select gate oxide 28 having a thickness of approximately 180 angstroms, and a tunnel oxide 30 having a thickness of approximately 90 angstroms, as shown in FIG. 1B. Thereafter, the select gate 14 and word-line gate 18 are built on top of the gate oxides 28 and 30.

Referring again to FIG. 2B, although the wet-etch process effectively removes the gate oxide 20 vertically from the word-line region 16, the gate oxide 20 is also removed horizontally due to the unidirectional nature of the wet-etch process. This results in a significant undercut 32 of the gate oxide 20 underneath the tunnel oxide mask 24. In the example above, for instance, removing 150 angstroms of the gate oxide 20 over the wordline region 16 may require that the wet-etch process be set to remove 200 angstroms to ensure that all the gate oxide 20 is removed. This will result in a 200 angstrom undercut 32.

If this undercut 32 reaches the location of the select gate 14, it will cause problems in the circuit. In order to prevent this, a very strict lithographic overlay requirement is needed to allow adequate separation between the edge of the tunnel oxide mask 24 and the location of the select gate 14. Because of this separation, it is not possible to pack the transistors on the chip as densely as would otherwise be possible.

Another method for removing material, other than a wet-etch process, is a dry-etch process. A dry-etch is an anisotropic process whereby ions and reactive gas species are used to remove material. Although a dry-etch is anisotropic, meaning that it removes material directionally, it has not traditionally been used to remove gate oxide in the above described process because the high-energy ions damage the gate area of the substrate and degrade device characteristics.

Accordingly, a method for minimizing the undercut 32 of gate oxide and relaxing the lithographic overlay requirement between the tunnel oxide mask 24 and a select gate 14 is needed. The present invention addresses such a need.

SUMMARY OF THE INVENTION

The present invention provides a method and system for etching gate oxide during transistor fabrication is disclosed. The method and system begins by depositing an oxide on a substrate, followed by a deposition of a mask over a portion of the gate oxide. The method and system further include performing a combination dry/wet-etch to remove the oxide uncovered by the mask, which minimizes oxide undercut.

According to the system and method disclosed herein, the present invention allows the lithographic overlay requirement between the tunnel oxide mask and a select gate to be relaxed, and enables denser memory arrays.

DETAILED DESCRIPTION OF THE INVENTION

Figure 1A:
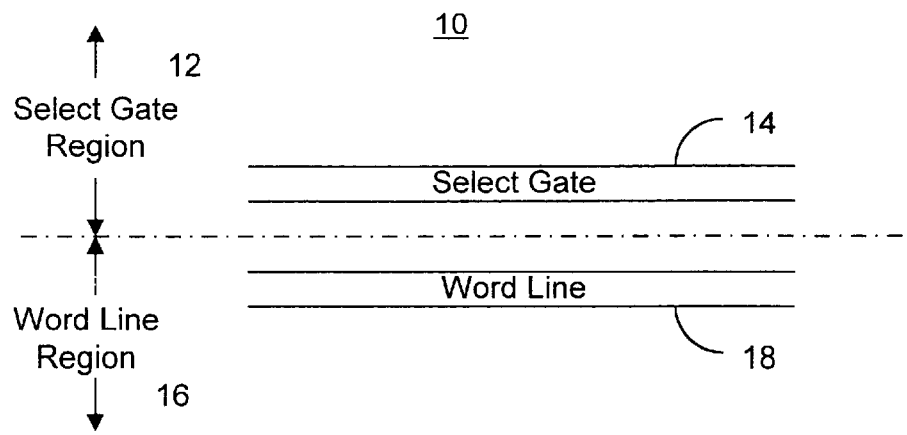
FIG. 1A is a top view of a portion of a flash memory array.
Figure 1B:
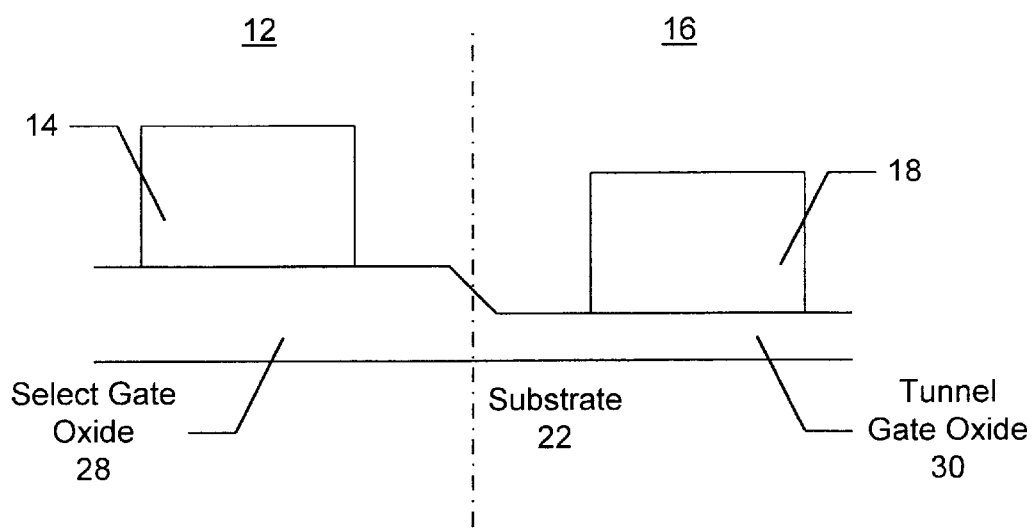
FIG. 1B is a cross-sectional view of the memory array 10.
Figure 2A:
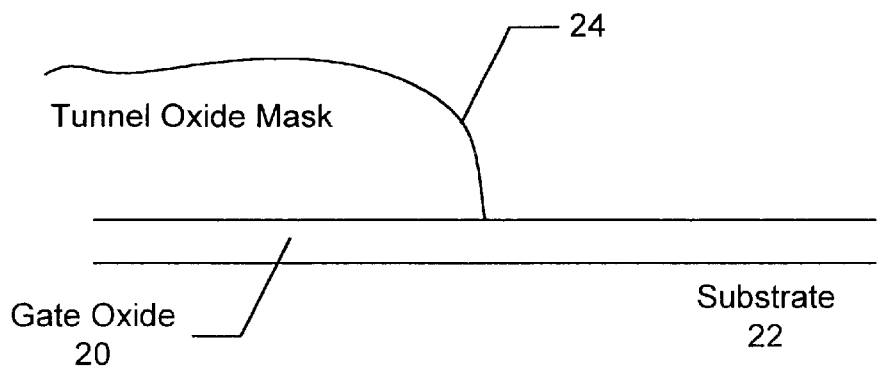
FIGS. 2A–2B are cross-sectional views of the memory array having a substantial gate oxide undercut when processed using conventional methods.
Figure 2B:
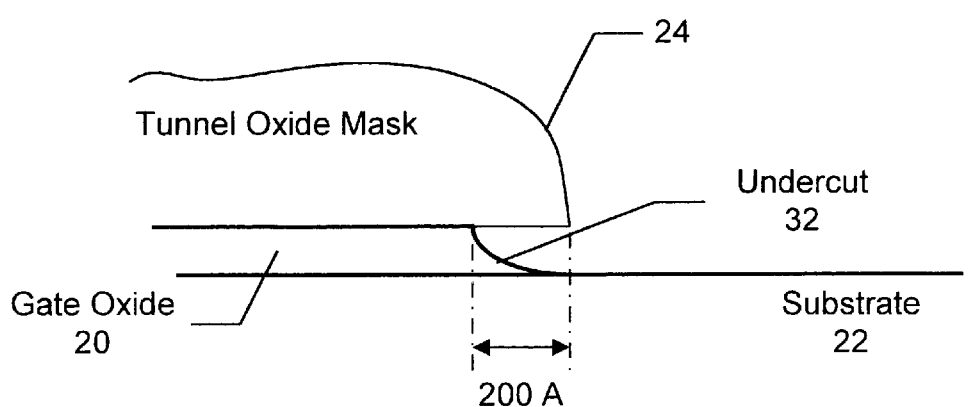

The present invention relates to an improvement in the fabrication of memory arrays. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be limited to the embodiment shown but is to be accorded the widest scope consistent with the principles and features described herein.

The present invention is a method and system for etching gate oxide, such that gate oxide undercut 32 is minimized during transistor fabrication. The present invention will be described in terms of a fabricating memory arrays 10 using gate oxide. However, one of ordinary skill in the art will readily recognize that this method and system will operate effectively for etching any type of material where a wet-etch process causes significant undercutting.

According the present invention, the tunnel oxide undercut 32 is reduced by providing a combination dry/wet-etch process. The combination dry/wet-etch process comprises a low-energy dry-etch to partially remove the gate oxide 20, followed by a brief wet-etch to remove the remaining gate oxide 20. Since most of the gate oxide 20 is removed by the low-energy dry-etch, the time for performing the wet-etch can be shortened thereby significantly reducing the gate oxide undercut 32. Reducing the gate oxide undercut 32, in turn, relaxes the lithographic overlay requirement between the tunnel oxide mask 24 and a select gate 14.

Figure 3A:
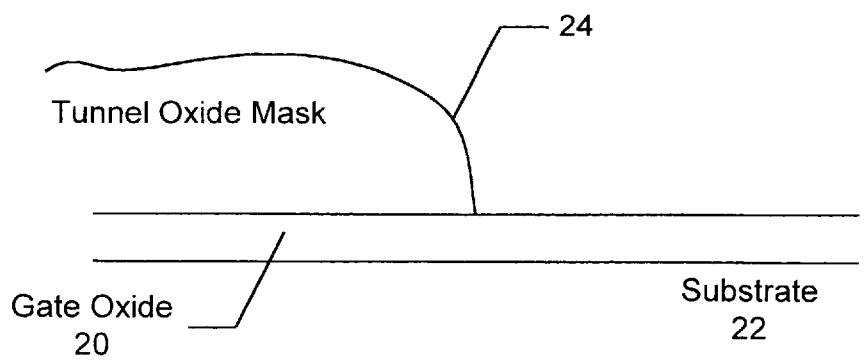
FIGS. 3A–3E are cross-sectional views of a substrate showing a process for reducing gate oxide undercut in accordance with the present invention.
Figure 3B:
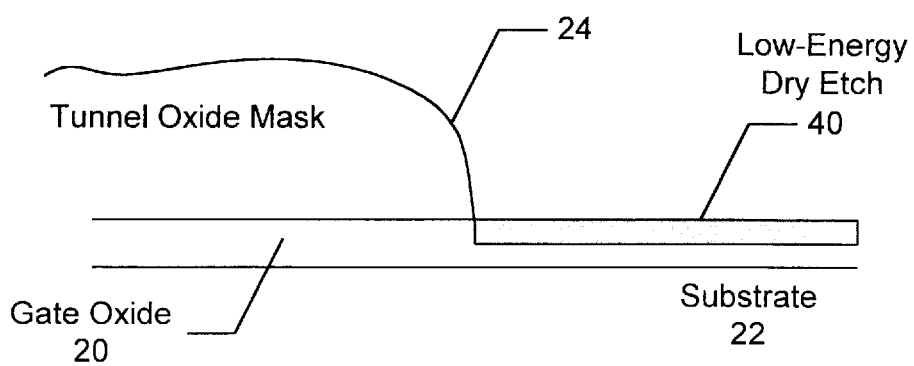

FIGS. 3A–3E are cross-sectional views of a substrate showing a process for reducing gate oxide undercut 32 in accordance with the present invention, where like components in the previous figures have like reference numerals. The process begins by depositing a layer of gate oxide 20 on the substrate 22, followed by a tunnel oxide mask 24, as shown in FIG. 3A. The gate oxide 20 may be approximately 150 angstroms thick, depending on the specific application.

According to the present invention, the conventional wet-etch of the gate oxide 20, which follows the tunnel oxide mask 24 step, is replaced with a combination dry/wet-etch. First, a low-energy dry-etch is performed to remove a portion of the gate oxide 20 in the word-line region 16, as shown by the hash lines in FIG. 3B.

The energy ions generated by a conventional dry-etch is approximately 500–1000 electron volts. This high icon energy can induce significant damage to the substrate 22. In the present invention, by contrast, the ion energy of the dry-etch is less than approximately 200 electron volts, hence the term low-energy dry-etch.

Figure 3C:
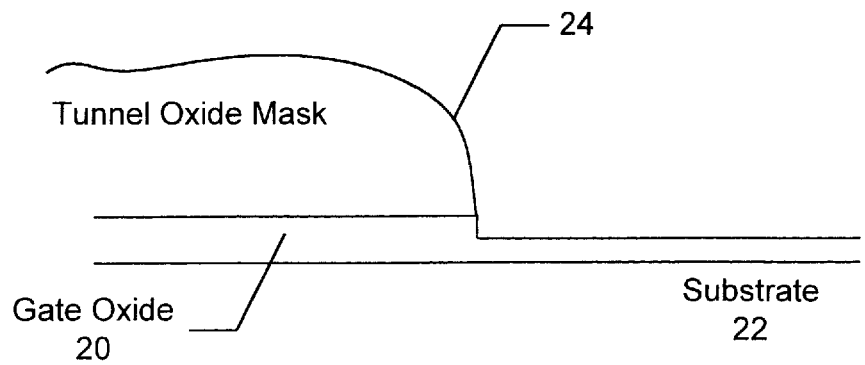

In a preferred embodiment of the present invention, the low-energy dry-etch removes a significant portion of the gate oxide 20 from the substrate 22. In the example where the gate oxide 20 is 150 angstroms thick, the low-energy dry-etch would remove about ⅔ or 100 angstroms of the gate oxide 20, leaving a remaining layer of approximately 50 angstroms. Using low energy and leaving a layer of gate oxide 20 on the substrate prevents the substrate 22 from being damaged by the dry-etch. And since the low-energy dry-etch is directional, there may still be some undercut in the gate oxide 20, but much less than a wet-etch, as shown in FIG. 3C. For example, removing 150 angstroms may result in only a 15 angstrom undercut using the low-energy dry-etch of the present invention.

Figure 3D:
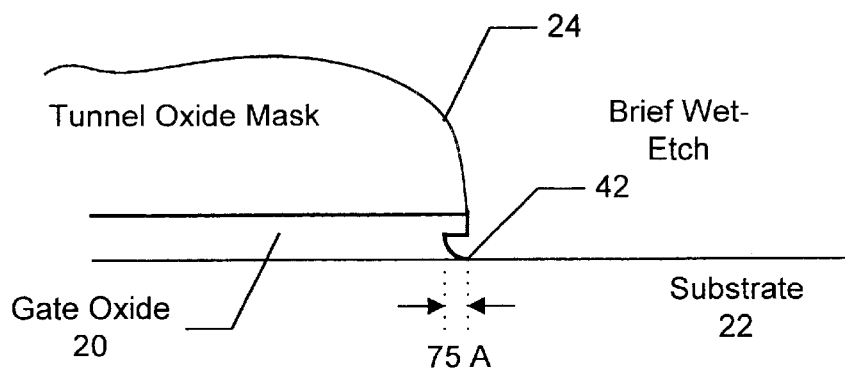

After the low-energy dry-etch is performed, a brief wet-etch is performed for a time necessary to remove any remaining gate oxide 20, as shown in FIG. 3D. Because the low-energy dry-etch removed most the gate oxide 20, the time for which the wet-etch is performed can be shortened, hence the term brief wet-etch. By comparison, a conventional wet-etch process may require approximately 60 seconds to remove all of the gate oxide 20, whereas the brief wet-etch may only require approximately 20 seconds to remove the remaining gate oxide 20, depending on the thickness. In the example where the remaining gate oxide 20 is 50 angstroms thick, the brief wet-etch may be set to remove 75 angstroms to ensure all the gate oxide 20 is removed. Due to the unidirectional nature of the wet-etch, this will result in only a 75 angstrom gate oxide undercut 42, compared with the traditional method that resulted in a 200 angstrom gate oxide undercut 32.

Performing the brief wet-etch after the low-energy dry-etch in accordance with the present invention also serves to remove any damage that may have been induced on the substrate 22 by the low-energy dry-etch.

Figure 3E:
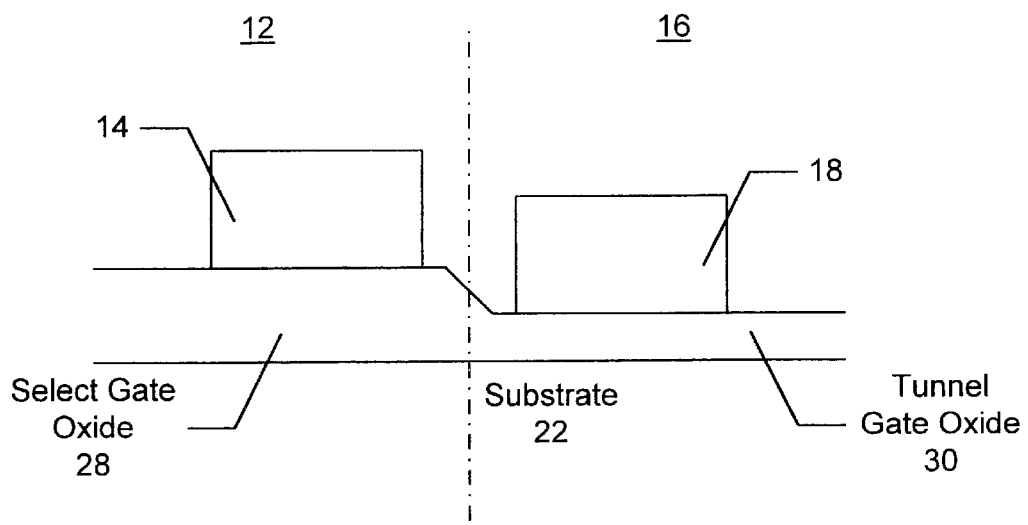

After the gate oxide 20 is removed from the word-line region 16 using the combination dry/wet-etch, the traditional process continues. As shown in FIG. 3E, the tunnel oxide mask 24 is removed, a layer of gate oxide 20 is grown over both regions, and the select and word-line gate 18s built on top. The difference between FIG. 1A and FIG. 3E is that due to the dry/wet etch of the present invention, the select gate 14 may be placed closer to the word line gate 18, making the memory array more dense.

A method and system for etching gate oxide using a combination low-energy dry-etch and brief wet-etch has been disclosed, such that gate oxide undercut is minimized during transistor fabrication. Reducing the gate oxide undercut in manners allows for a relaxed lithographic overlay requirement between the tunnel oxide mask and a select gate, and a more densely packed memory array.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A method for etching gate oxide when forming a select gate region and a word-line region during transistor fabrication, comprising the steps of:

(a) depositing a gate oxide on a substrate;

(b) depositing a tunnel oxide mask over a portion of the gate oxide; and (c) performing a combination dry/wet-etch to remove the gate oxide uncovered by the tunnel oxide mask over the word-line region, the combination dry/wet-etch including the steps of, (i) performing dry-etch at less than approximately 200 electron volts to remove approximately two thirds of the gate oxide, and (ii) performing a wet-etch for a time sufficient to remove any remaining gate oxide, thereby minimizing tunnel oxide undercut and allowing the select gate region to be placed closer to the word-line region.

* * * * *